US006311318B1

(12) United States Patent
Souef et al.

(10) Patent No.: US 6,311,318 B1
(45) Date of Patent: Oct. 30, 2001

(54) DESIGN FOR TEST AREA OPTIMIZATION ALGORITHM

(75) Inventors: Laurent Souef, Montauroux; Jerome Bombal, La Trinite; Bernard Ginetti, Antibes, all of (FR)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/353,306

(22) Filed: Jul. 13, 1999

(51) Int. Cl.$^7$ .................................................. G06F 17/50
(52) U.S. Cl. ................................... 716/18; 716/4
(58) Field of Search ..................... 716/18, 4; 714/726, 714/727, 30

(56) References Cited

U.S. PATENT DOCUMENTS

| | | | |
|---|---|---|---|
| 5,406,497 | 4/1995 | Altheimer et al. | 364/489 |
| 5,550,839 | 8/1996 | Buch et al. | 371/22.1 |
| 5,684,808 | 11/1997 | Valind | 371/22.3 |
| 5,689,517 | 11/1997 | Ruparel | 371/22.3 |
| 5,696,771 | 12/1997 | Beausang et al. | 371/22.3 |
| 5,812,561 | 9/1998 | Giles et al. | 371/22.31 |
| 5,831,868 | 11/1998 | Beausang et al. | 364/489 |
| 5,862,149 | 1/1999 | Carpenter et al. | 371/22.3 |
| 5,903,466 | * 5/1999 | Beausang et al. | 364/488 |
| 6,059,451 | * 5/2000 | Scott et al. | 371/22.31 |
| 6,067,650 | * 5/2000 | Beausang et al. | 714/726 |
| 6,081,916 | * 6/2000 | Whetsel, Jr. | 714/727 |
| 6,114,892 | * 9/2000 | Jin | 327/202 |
| 6,212,656 | * 4/2001 | Fosco et al. | 714/726 |

OTHER PUBLICATIONS

Lee et al "Using a Single Input to Support Multiple Scan Chains," IEEE, Nov. 1998, pp. 74–78.*
James T. O'Connor, "A Methodology for Programmable Logic Migration to ASIC's Including Automatic Scan Chain Insertion and ATPG," IEEE, 1991, pp. P2–1.1–P2–1.4.*
Kenneth D. Wagner, "Robust Scan–Based Logic Test in VDSM Technologies," IEEE, Nov. 1999, pp. 66–74.*
Barbagallo et al, "Scan Insertion Criteria for Low Design Impact," IEEE, 1996, pp. 26–31.*

* cited by examiner

Primary Examiner—Matthew Smith
Assistant Examiner—Vuthe Siek
(74) Attorney, Agent, or Firm—Wells, St. John, Roberts, Gregory & Matkin, P.S.

(57) ABSTRACT

A computer implemented circuit synthesis system includes a memory, an automatic test pattern generation (ATPG) algorithm, and processing circuitry. The memory is configured to provide a database, and is operative to store a netlist including nets of an integrated circuit under design. The automatic test pattern generation (ATPG) algorithm is operative to design and test an integrated circuit design. The processing circuitry is configured to reduce layout area used during scan insertion, and is operative to: a) identify logic registers of a proposed integrated circuit design that are stitched as a shift register; b) use the ATPG algorithm to transform identified logical registers into scan equivalent logical registers; c) stitch scan equivalent logical registers in an order in which the scan equivalent logical registers were stitched; d) identify stitched scan equivalent logical registers having a same net on both an SI port and a D port; and e) replace the stitched scan equivalent logical registers having the same net on both the SI port and D port. A method is also provided for reducing layout area during test insertion when using an ATPG program to design an integrated circuit having design-for-testability features.

32 Claims, 6 Drawing Sheets

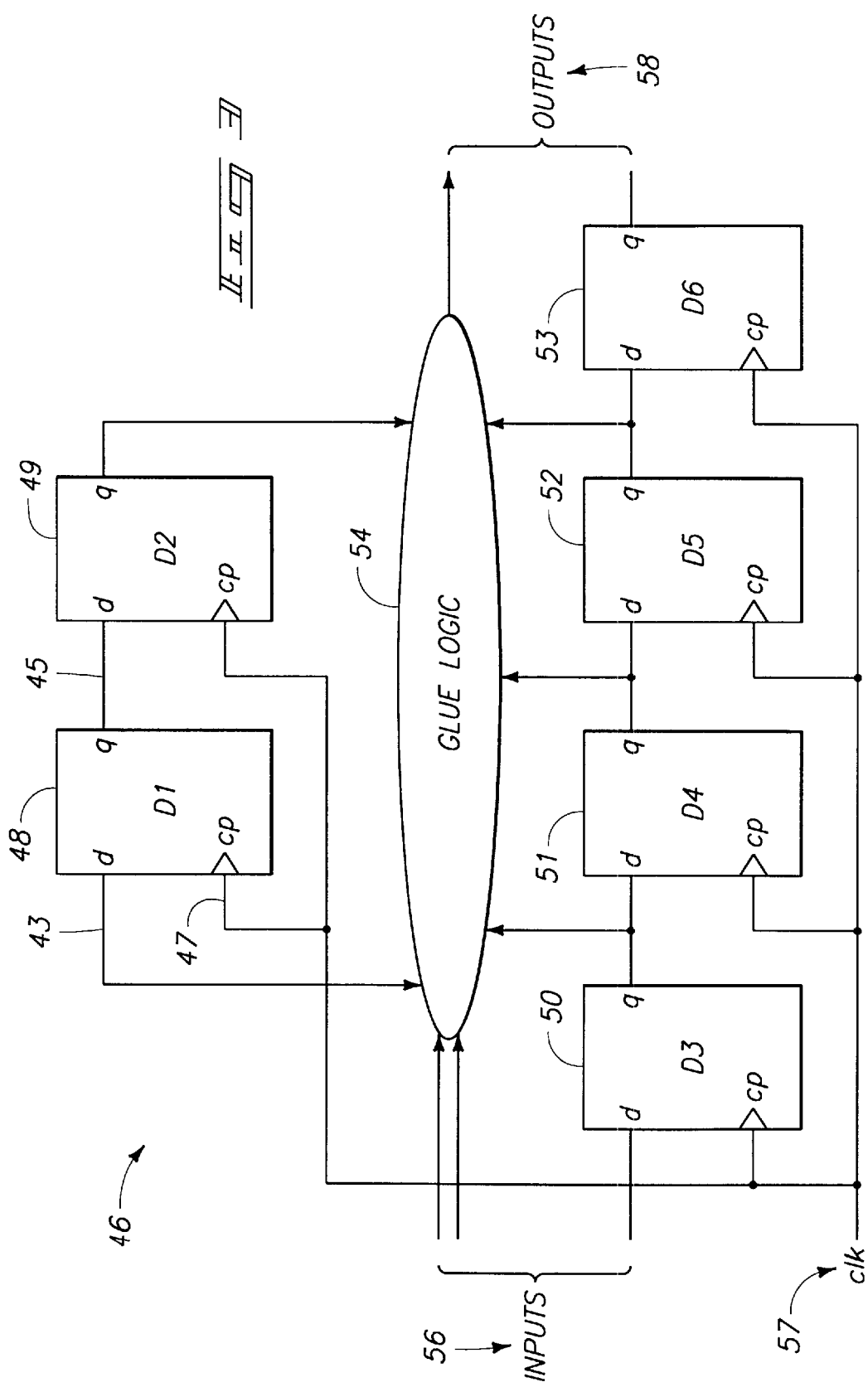

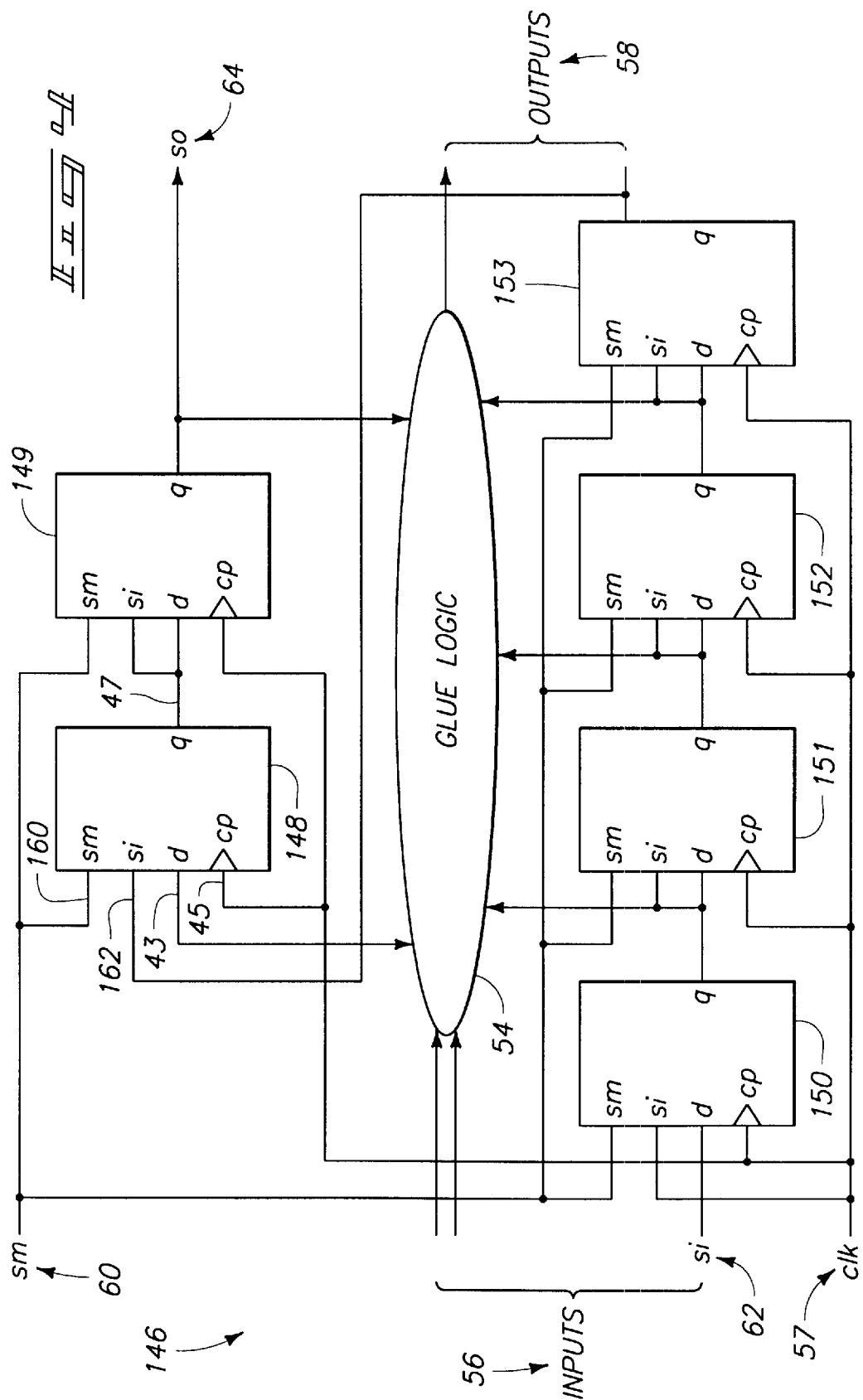

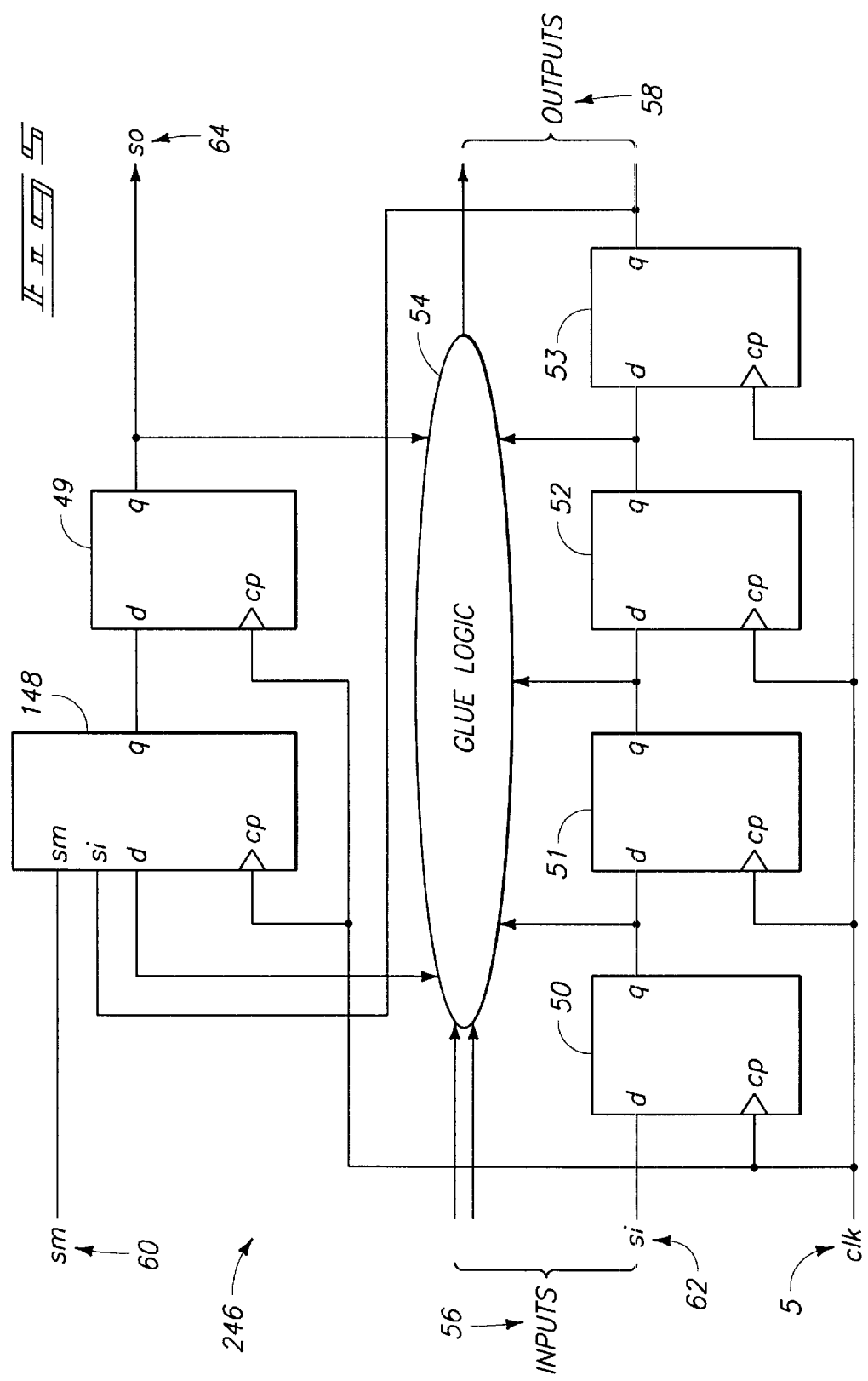

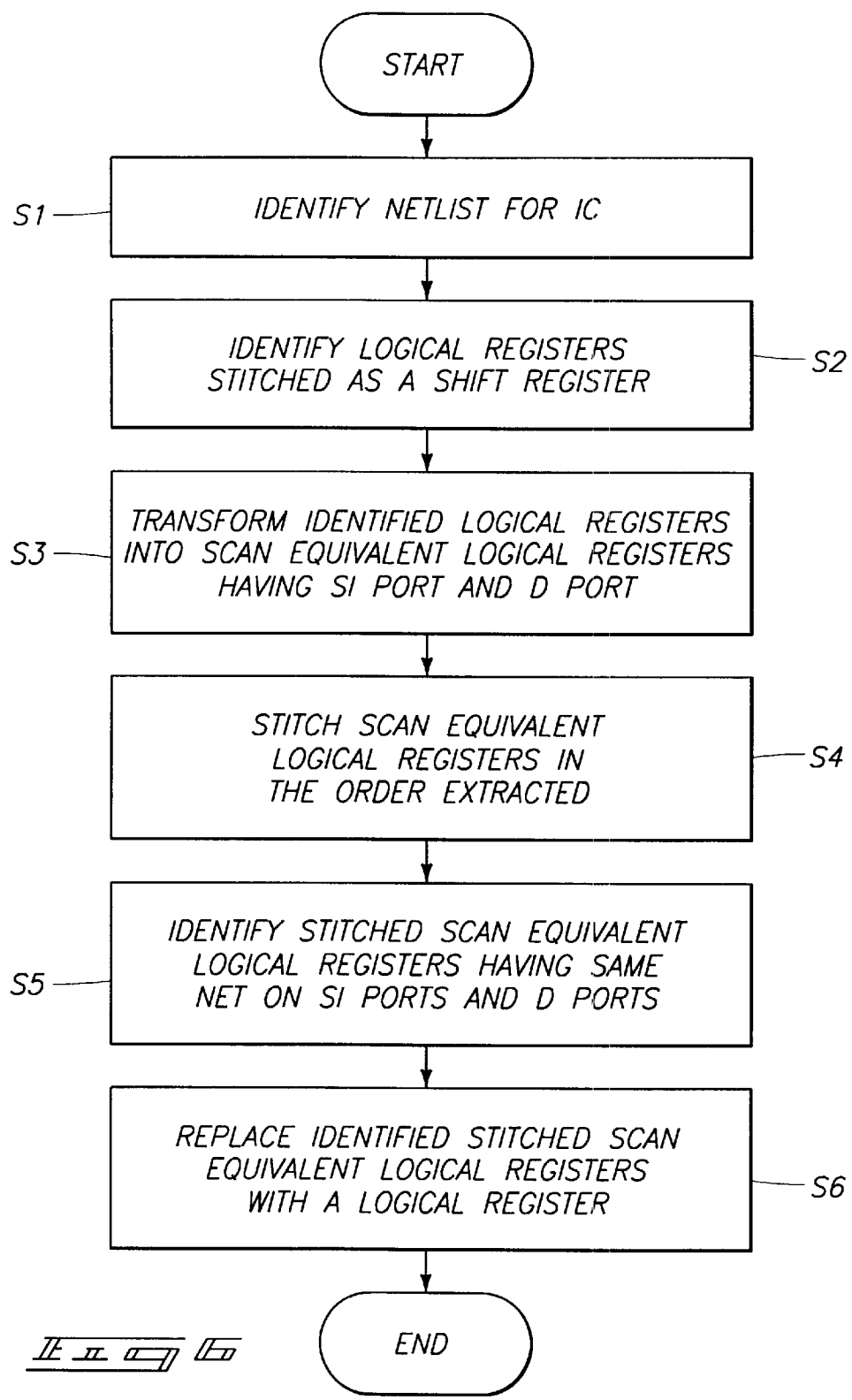

DESIGN FOR TEST AREA OPTIMIZATION ALGORITHM

TECHNICAL FIELD

The present invention relates generally to the design and test of integrated circuit devices, and more particularly, to logic synthesis for improved automatic test pattern generation (ATPG) during the design and test of integrated circuits.

BACKGROUND OF THE INVENTION

The design process for integrated circuits has evolved from a relatively simple process, where relatively few circuits were initially placed onto a circuit layout, to modern complex integrated circuits, where computer aided design (CAD) tools are used to realize a circuit layout. The use of CAD tools to lay out complex integrated circuits, such as application specific integrated circuits (ASICs) and field programmable gate arrays (FPGAs), is commonly referred to as electronic design automation (EDA). The only feasible technique for designing, verifying, and testing modern complex integrated circuits is with the use of programmable computer systems that enable a user to realize normal circuit implementations.

One technique for specifying an integrated circuit design is with a hardware description language (HDL) such as VHDL. A hardware description language (HDL) enables representation of an integrated circuit design at a logical level, and provides a high level design language. An integrated circuit is represented in several different levels, comprising different layers of abstraction. Silicon compilers, comprising synthesis programs, are used to yield a final implementation wherein the programs generate sufficient detail to proceed directly to silicon fabrication.

A compiler generates a netlist of generic primitive cells during the processing of an HDL. A netlist is a list of all the nets, or collection of pins needing to be electrically connected, in a circuit. The netlist consists of a detailed list of interconnections and logic components, and can include primitive cells such as XOR gates, NAND gates, latches and D-flip flops and their associated interconnections.

The silicon compiler first generates a netlist of independent cells, then applies a particular cell library to the resulting generic netlist via a process called mapping. As a consequence, a dependent mapped netlist is generated which uses standard circuits that are available within a cell library and which are available to the computer system.

Silicon compilers and mapping programs are well understood in the art, and are described in numerous patents including U.S. Pat. Nos. 5,406,497 and 5,831,868.

Design for testability (DFT) forms an important part of the logic synthesis process. More particularly, design for testability (DFT) involves the up-front consideration of product testability considerations while designing a circuit. Low-cost/high-volume manufacturing has recently dictated that product testability be considered at the onset of circuit design, otherwise products will be inherently hard to test and will cost time and money to achieve desired levels of quality.

Accordingly, numerous programs are known for aiding in the testability process of logic synthesis. For example, it is known to take a mapped netlist that is generated from a silicon compiler, and interchange specific memory cells and circuitry with special memory cells that enable the application of test vectors to specific logic portions of an integrated circuit. The application of such special memory cells in order to apply test vectors to stimulate the design is referred to as a design-for-testability (DFT) implementation.

A number of techniques are known for generating non-exhaustive sets of test patterns that validate functionality and identify faults within a circuit design. Automatic test pattern generation (ATPG) programs are known in the art for providing a reduced size test set while maximizing fault coverage for the design. However, these techniques require a significant test area when integrating design-for-testability (DFT) features since present ATPGs transform regular flip-flop elements into MUX flip-flops elements during a scan insertion whether or not the topology of the circuit requires such substitution. Therefore, a technique is required which significantly decreases the test area cost that is associated with integrating design-for-testability (DFT) features into a circuit design.

SUMMARY OF THE INVENTION

The present invention is a method and an apparatus for implementing automatic test pattern generation (ATPG) with a computer system so as to reduce the area cost when implementing test insertion. More particularly, during scan insertion a field transform is implemented wherein regular flip-flop elements are transformed into MUX flip-flop elements irrespective of the topology of the circuit. However, current topology is considered when identifying already stitched flip-flops by integrating such flip-flops into a scan chain without transforming the flip-flops into MUX flip-flops.

According to one aspect of the invention, a computer implemented circuit synthesis system includes a memory, an automatic test pattern generation (ATPG) algorithm, and processing circuitry. The memory is configured to provide a database, and is operative to store a netlist including nets of an integrated circuit under design. The automatic test pattern generation (ATPG) algorithm is operative to design and test an integrated circuit design. The processing circuitry is configured to reduce layout area used during scan insertion, and is operative to: a) identify logic registers of a proposed integrated circuit design that are stitched as a shift register; b) use the ATPG algorithm to transform identified logical registers into scan equivalent logical registers; c) stitch scan equivalent logical registers in an order in which the scan equivalent logical registers were stitched; d) identify stitched scan equivalent logical registers having a same net on both an SI port and a D port; and e) replace the stitched scan equivalent logical registers having the same net on both the SI port and the D port.

According to another aspect of the invention, a method is provided for reducing area used during test insertion when using an automatic test pattern generator (ATPG) algorithm. The method includes the steps of: identifying a netlist of an integrated circuit which includes nets; identifying a plurality of logical registers of the integrated circuit that are stitched as a shift register; transforming the identified logical registers into scan equivalent logical registers, wherein each scan equivalent logical register has an SI port and a D port; stitching the scan equivalent logical registers following the order in which the scan equivalent logical registers were extracted; and identifying the stitched scan equivalent logical registers having the same net on the respective SI ports and D ports; and replacing the stitched scan equivalent logical registers having the same net on the respective SI ports and D ports with a logical register.

According to yet another aspect of the invention, in an electronic design automation system having a processor, memory and an automatic test pattern generation (ATPG) algorithm for designing and testing an integrated circuit, the logic design of the integrated circuit including nets of the integrated circuit providing a netlist, a method is provided for reducing area used during test insertion when using the ATPG algorithm. The method includes the steps of: providing a netlist associated with an integrated circuit; screening the netlist to identify flip-flop elements that are stitched as a shift register; transforming all the identified flip-flop elements that are stitched as a shift register into respective scan equivalent flip-flop elements with the ATPG algorithm wherein each scan equivalent flip-flop element includes an SI port and a D port; stitching the scan equivalent flip-flop elements following the order in which the scan equivalent flip-flop elements were extracted; and replacing at least one of a plurality of the scan equivalent flip-flop elements having the same net on the SI port and the D port by a flip-flop element.

BRIEF DESCRIPTION OF THE DRAWINGS

Preferred embodiments of the invention described below with reference to the following accompanying drawings.

FIG. 3 is a simplified schematic circuit diagram illustrating a circuit prior to scan insertion pursuant to the techniques of Applicant's invention.

Fig 4 is a simplified schematic circuit diagram illustrating the circuit of FIG. 3 after scan insertion using a standard ATPG algorithm.

FIG. 5 is a simplified schematic circuit diagram illustrating the circuit of FIG. 3 after scan insertion using the techniques of Applicant's invention.

FIG. 6 is a logic flow diagram illustrating one exemplary procedure of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention is a method and an apparatus for implementing automatic test pattern generation (ATPG) with a computer system so as to reduce the area cost when implementing test insertion. More particularly, during scan insertion a field transform is implemented wherein only specific regular flip-flop elements are transformed into MUX flip-flop elements based upon the topology of the circuit.

In the following description, numerous specific details are set forth, such as particular architecture, hardware configurations, etc., in order to provide a thorough understanding of the present invention. However, it will be apparent to one skilled in the art that the present invention may be practiced without these specific details. In other instances, well-known methods and hardware configurations are not described in detail in order to not obscure the present invention.

It is understood that the present invention is comprised of an algorithm, hardware and a method that are readily implemented and manufactured using well known computer aided design (CAD) tools and methods. The detailed descriptions presented below are provided largely in terms of algorithms and symbolic representations of operations on data bits within a computer memory. Such algorithmic descriptions and representations are the means used by those skilled in the data processing arts to most effectively convey the substance of their work to those skilled in the art.

The present invention addresses an inherent problem of implementing automatic test pattern generation (ATPG) in a manner that reduces the area cost, or layout space, that is needed during test insertion when implementing design for testability (DFT) within a circuit.

Figure 1:
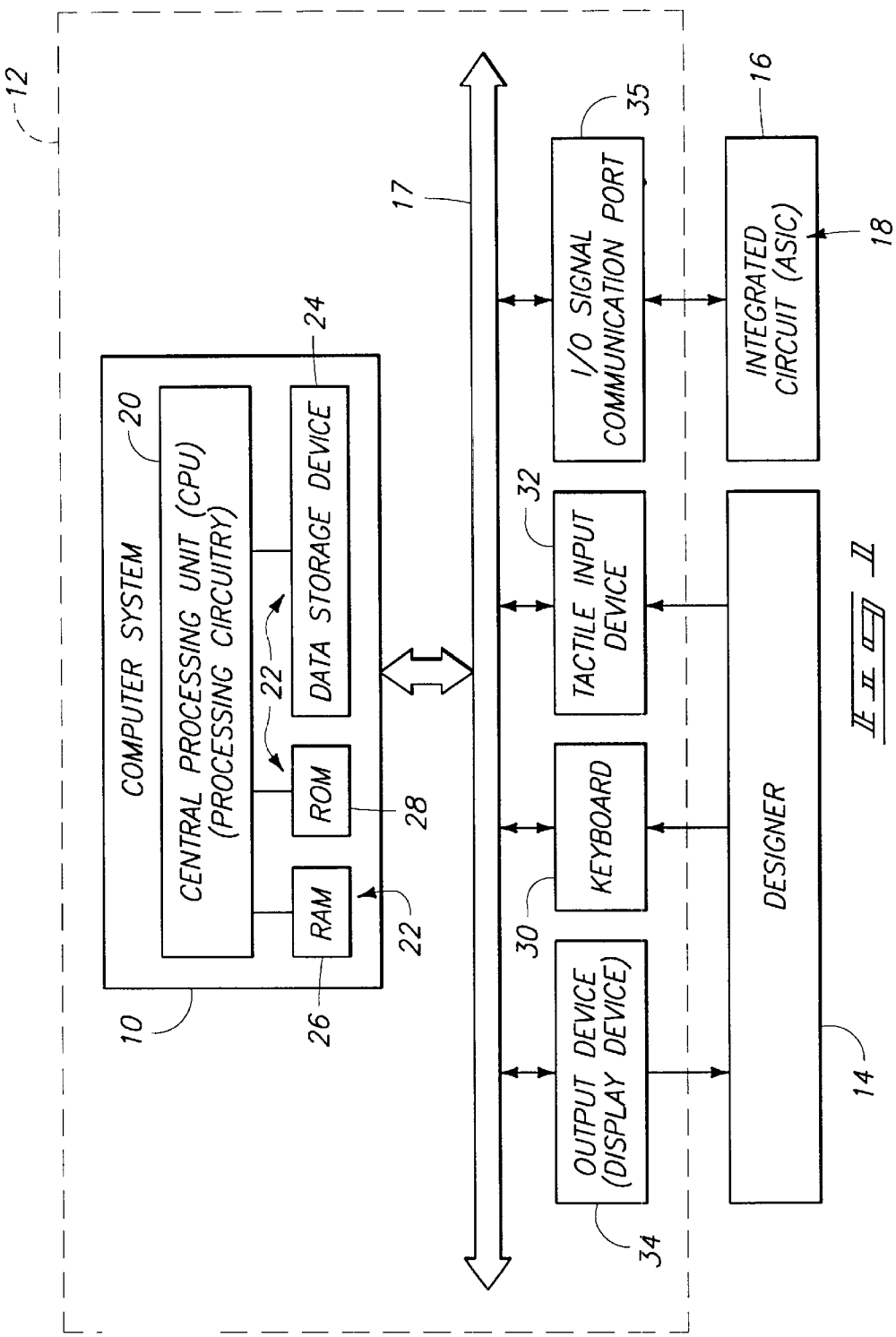
FIG. 1 is an exemplary computer system comprising a computer aided design (CAD) system used in accordance with the present invention.

FIG. 1 is a block diagram of a computer system incorporating the novel aspects of Applicant's invention and identified by reference numeral 10. Computer system 10 is configured to implement an electronic design automation (EDA) system 12. A circuit designer 14 inputs an integrated circuit design that includes design-for-testability features, validates the design, places components onto a chip layout, and routes connections between components. According to one construction, an integrated circuit 16 under design and test comprises an application specific integrated circuit (ASIC) 18.

Electronic design automation (EDA) system 12 includes a central processing unit (CPU), or processor, 20, memory 22, and a data storage device 24. In one form, memory 22 comprises random access memory 26, read only memory 28, and a data storage device 24. In one form, data storage device 24 comprises a hard disk drive. CPU 20 is used to implement an operating system and application programs, such as an EDA program. Furthermore, CPU 20 is used to implement the novel features of Applicant's invention.

A designer 14 inputs design information into EDA system 12 via a keyboard 30 and/or a cursor manipulating tactile input device 32, such as a mouse or a touchpad. However, it is understood that other forms of input devices can also be used including voice recognition systems, joysticks, graphics tablets, data readers, card readers, magnetic and optical readers, other computer systems, etc. Designer 14 receives visual feedback on the design process via an output device 34. According to one construction, output device 34 comprises a graphics display terminal, such as a CRT display or a liquid crystal display. During synthesis and testing of a design, memory 22 is used to store logic design information for an integrated circuit 16 under design.

Figure 2:
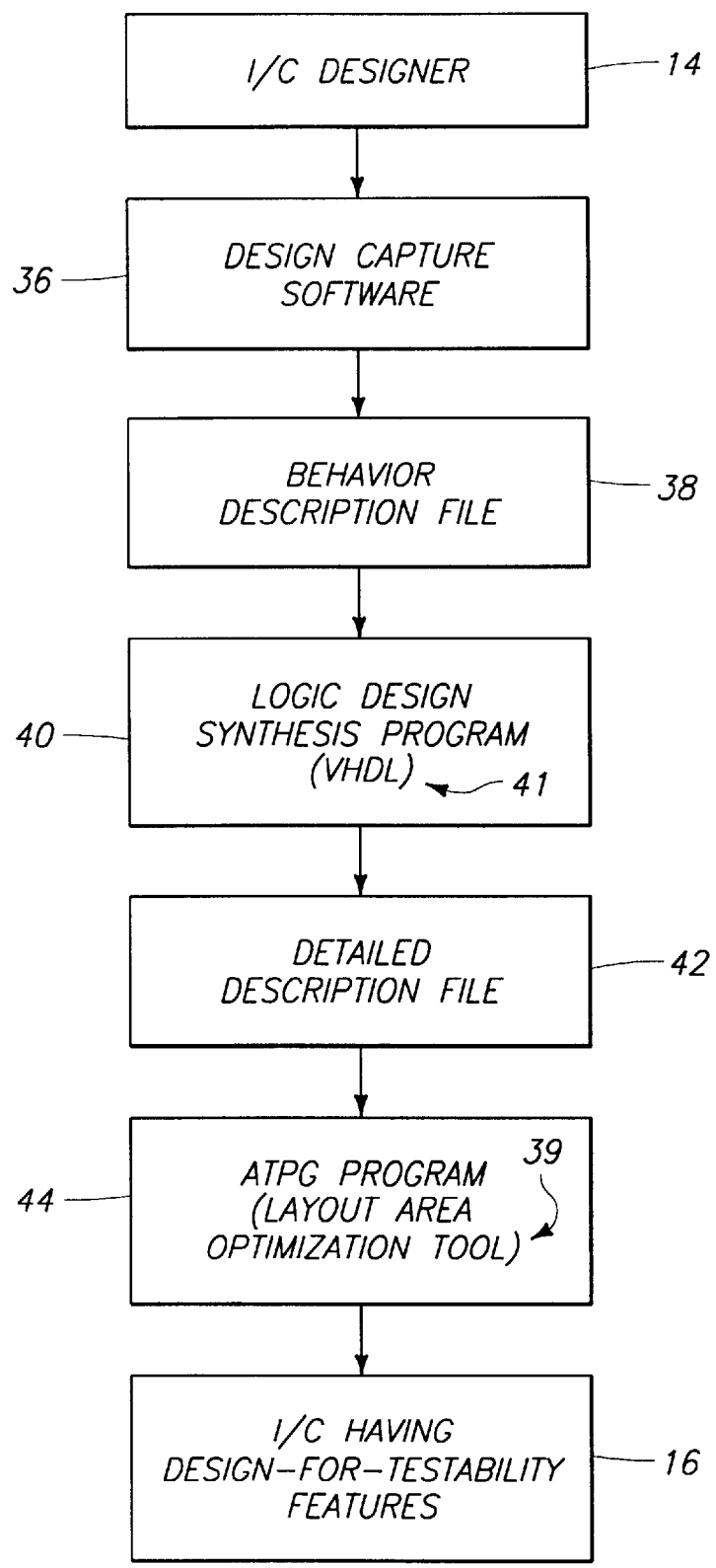
FIG. 2 is a simplified block diagram of the design process for an integrated circuit having design-for-testability features pursuant to the techniques of Applicant's invention.

In operation, designer 14 of FIG. 2 specifies the logic design of integrated circuit 14 via a commercially available form of design capture software 36 such as software that is commercially available from Synopsis, Inc. and Cadence Design Systems, Inc. A behavior description file 38 is output from the design capture software 36. The behavior description file 38 is written in a hardware description language (HDL), such as VHDL. The behavior description file 38 represents the logic design of a proposed design at a register transfer level.

The behavior description file 38 provides an input to a logic design synthesis program 40, such as a VHDL design compiler 41. The logic design synthesis program 40 is operative to create circuitry and gates necessary to realize a design that has been specified by the behavior description file 38. One commercially available VHDL design compiler is sold by Synopsis, Inc. The VHDL design compiler cooperates with the logic synthesis design compiler 38 to generate a detailed description file 42. The detailed description file 42 includes a gate-level definition of the logic design for the proposed integrated circuit design. The detailed description file 42 comprises a netlist for the design under consideration.

Detailed description file 42 is input into several EDA system programs such as an automatic test pattern generation (ATPG) program 44, as well as placement and routing tools, timing analyzers, and simulation programs. ATPG program 44 generates test patterns that are input to computerized test equipment 46 for testing a proposed design for an integrated circuit. Accordingly, a netlist, in the form of detailed description file 42, is input to ATPG program 44. However, ATPG program 44 includes Applicant's invention comprising a layout area optimization tool 39 that reduces layout area when implementing design-for-testability into an integrated circuit 16 design.

For a large integrated circuit such as a large application specific integrated circuit (ASIC), a design is broken into small sections of combinational logic. Once a design has been broken into such smaller sections, with individual sections being grouped together into partitions, an ATPG program is used to generate test patterns. The ATPG program begins with one specific net within a partition for which test patterns are then generated.

The present invention decreases the test area, and consequently, the time needed for partitioning and test pattern generation.

The present invention takes advantage of the circuit topology for an integrated circuit that is under design by identifying flip-flops that are already stitched, then integrating those identified flip-flop elements into a scan chain without transforming them into MUX flip-flop elements. Accordingly, the test area cost is lowered. In contrast, prior art ATPG programs transform regular flip-flop elements into MUX flip-flop elements during scan insertion, regardless of the topology of the integrated circuit.

A technique for efficiently inserting testability into integrated circuit designs is illustrated below with reference to FIGS. 3–5, using the architecture depicted in FIG. 1 and steps illustrated in FIG. 2. Such technique can be implemented as an algorithm that is incorporated into the design of an ATPG program similar to those ATPG programs that are presently commercially available, such as tool 39 (of FIG. 2). A primary purpose for such technique is to reduce the additional area that is required in layout when inserting design-for-testability features into an integrated circuit. Such additional area is required when using prior art techniques during test insertion.

Applicant's novel invention involves adapting presently available automatic test pattern generation (ATPG) programs 44 to reduce the amount of flip-flop elements that need to be transformed into scan elements. Such implementation has been found to reduce significantly the amount of test area required when implementing design for testability on an integrated circuit design.

Applicant's technique takes advantage of the existing topology of an integrated circuit in order to minimize the layout area required to realize the integrated circuit design having design-for-testability features. As will be shown below with reference to FIGS. 3–5, Applicant's technique comprises an algorithm that is implemented in three phases. It is understood that the programming of such technique can be realized by rendering the implementation of such phases into a subroutine within an ATPG program, comprising an algorithm, according to principles that are well understood in the art. Additionally, the following exemplary implementation depicted below with reference to FIGS. 3–5 is illustrated using shift registers as an example, but Applicant's invention is not intended to be limited solely to this structure as additional circuit applications are further intended. For example, Applicant's invention can be implemented with linear feedback shift registers (LFSRs), filters, serial-to-parallel converters, parallel-to-serial converters, and state machines using token ring methods.

As shown in FIG. 3, the netlist for a proposed design for an integrated circuit 46 is screened using an ATPG program having Applicant's novel features which are run on an EDA system. The netlist is screened before scan insertion in order to detect the presence of any flip-flop elements that are already stitched as a shift register. For example, flip-flops D1, D2, D3, D4, D5 and D6 (identified by reference numerals 48–53, respectively) are detected in FIG. 3 during such screening of the netlist. Also according to FIG. 3, all d-flip-flops 48–53 are clocked using a common clock signal 57.

FIG. 3 illustrates Phase I according to one implementation of Applicant's invention where a proposed integrated circuit 46 is shown before scan insertion. However, it is understood that other integrated circuit implementations could be utilized. At least one input 56 is provided to glue logic 54 and d-flip-flop 50. At least one output 58 is generated by glue logic 54 and d-flip-flop 53. It is understood that glue logic 54 comprises combinational logic. It is also understood that such exemplary circuit 46, according to one embodiment, is screened. However, according to an optional implementation, a list of elements is given directly to the tool provided by Applicant's invention. For example, a netlist can be given directly to an ATPG program having Applicant's novel invention, such that the netlist is reviewed to locate all flip-flop elements that are already stitched as a shift register.

FIG. 4 illustrates Phase 11 of Applicant's invention where the ATPG program uses prior art algorithms, presently commercially available within an ATPG program, to transform all the located flip-flop elements into respective scan equivalents. Such technique is presently understood in the art and is not described here in greater detail in order to not obscure the intended novel aspects of Applicant's invention.

As shown in FIG. 4, an ATPG program is first used to transform all located flip-flop elements 48–53 (of FIG. 3) into scan equivalents, comprising MUX-flip-flops 148–153, respectively. Accordingly, the proposed integrated circuit 46 (of FIG. 3), following the scan insertion of Phase II using a standard ATPG algorithm, becomes scan insertion integrated circuit 146 (of FIG. 4). Following such transform, the resulting MUX-flip-flops are stitched following the order in which they were extracted in Phase I as shown above in FIG. 3.

Pursuant to scan insertion integrated circuit 146 of FIG. 4, each MUX-flip-flop comprises a two-port d-flip-flop that can be selectively loaded from one or two sources. For example, MUX-flip-flop 148 comprises a two-port d-flip-flop having input ports 43 and 162. Port 43 comprises a d-input, and port 162 comprises a scan insertion (si) input. Port 47 comprises a q-output, and port 160 comprises a scan mode (sm) input.

In operation, scan mode input 60 is delivered to each MUX-flip-flop 148–153 at each scan mode port 160. However, implementation of Applicant's invention significantly reduces the test area required to implement scan mode integrated circuit 146 by eliminating redundant features. More particularly, Phase III is implemented below in order to replace all MUX-flip-flop elements 149–153 that have the same net on their si-port 162 and d-port 43 by a normal d-flip-flop 49–53, respectively.

As shown in FIG. 5, the tool of Applicant's invention is used to screen the netlist of scan mode integrated circuit 146

(of FIG. 4) in order to replace all the MUX-flip-flops 149–153 that have the same net on their si-port 162 and d-port 43 by a normal d-flip-flop 49–53, respectively. Accordingly a resulting integrated circuit 246 is depicted in FIG. 5, following scan insertion using Applicant's novel invention.

By screening the netlist for the integrated circuit 146 (of FIG. 4) and replacing all the MUX-flip-flops 149–153, having the same net on the si-port and the d-port, with a normal d-flip-flop, a significant test area savings can be made. More particularly, FIG. 5 shows that a significant amount of d-flip-flop elements 49–53 did not need to be transformed into scan elements (namely, MUX-flip-flops 149–153 of FIG. 4). In fact, only original d-flip-flop 48 was required to be transformed into scan element, or MUX-flip-flop, 148. Hence, the layout area save can be significant.

However, it should be realized from one example that the total amount of layout area save by implementation of Applicant's tool will vary, and will be dependent on the design structure being realized by a particular proposed integrated circuit design. It is presently believed that Applicant's invention will be proved very efficient for integrated circuit designs containing one or more of shift registers, linear feedback shift registers (LFSRs), serial-to-parallel converters, parallel-to-serial converters, state machines that use token ring methods, and digital filters.

Yet another important advantage provided by implementing Applicant's invention results in that, for the case of regular test insertion, the resulting structure (i.e., MUX-flip-flops) can create a log of untestable faults. Indeed, due to the redundance of si-ports and d-ports, scan mode (sm) is no more testable. Thus, Applicant's invention also enhances the global fault coverage of an integrated circuit design under consideration.

Pursuant to Applicant's invention, an apparatus and method are provided for incorporation into any ATPG algorithm, or program, which can take advantage of the existing functional structure of a netlist in order to transform a part of the netlist, or circuit layout, into a design-for-testability integrated circuit. This technique includes, but is not intended to be limited to, shift registers, XOR trees (e.g., those found in comparators), etc.

FIG. 6 is a logic flow diagram illustrating one exemplary procedure according to the present invention. FIG. 6 illustrates one embodiment of a software-based algorithm implementation for realizing Applicant's inventions within a modified automatic test pattern generation (ATPG) program. Such implementation can be realized via processing circuitry and memory, such as is available on a computer system on which electronic design automation (EDA) programs, including automatic test pattern generation (ATPG) programs, are implemented.

The logic flow diagram of FIG. 6 is initiated by a designer during utilization of the modified automatic test pattern generation (ATPG) program via the computer. According to Step "S1", a netlist is identified for an integrated circuit which includes nets. After performing Step "S1", the process proceeds to Step "S2".

In Step "S2", the process identifies a plurality of logical registers for the integrated circuit that are stitched as a shift register. After performing Step "S2", the process proceeds to Step "S3".

In Step "S3", the process transforms the identified logical registers into scan equivalent logical registers, wherein each scan equivalent logical register has an SI port and a D port. After performing Step "S3", the process proceeds to Step "S4".

In Step "S4", the process stitches the scan equivalent logical registers following the order in which the scan equivalent logical registers were extracted. After performing Step "S4", the process proceeds to Step "S5".

In Step "S5", the process identifies the stitched scan equivalent logical registers having the same net on the respective SI ports and D ports. After performing Step "S5", the process proceeds to Step "S6".

In Step "S6", the process replaces the stitched scan equivalent logical registers having the same net on the respective SI ports and D ports with a logical register. After performing Step "S6", the process is complete and terminates. Following the implementation of such Step "S6", an integrated circuit design is provided having design-for-testability features.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A computer implemented circuit synthesis system, comprising:
   memory configured to provide a database and operative to store a netlist including nets of an integrated circuit under design;
   an automatic test pattern generation (ATPG) algorithm operative to design and test an integrated circuit design; and
   processing circuitry configured to reduce layout area used during scan insertion and operative to: a) identify logical registers of a proposed integrated circuit design that are stitched as a shift register; b) use the ATPG algorithm to transform identified logical registers into scan equivalent logical registers; c) stitch scan equivalent logical registers in an order in which the scan equivalent logical registers were stitched; d) identify stitched scan equivalent logical registers having a same net on both an SI port and a D port; and e) replace the stitched scan equivalent logical registers having the same net on both the SI port and D port with a logical register.

2. The circuit synthesis system of claim 1 wherein the processing circuitry comprises a processor configured to implement the ATPG program.

3. The circuit synthesis system of claim 1 wherein the automatic test pattern generation (ATPG) algorithm is implemented on the processing circuitry, and wherein the ATPG algorithm is implemented to: a) identify logical registers of a proposed integrated circuit design that are stitched as a shift register; b) use the ATPG algorithm to transform identified logical registers into scan equivalent logical registers; c) stitch scan equivalent logical registers in an order in which the scan equivalent logical registers were stitched; d) identify stitched scan equivalent logical registers having a same net on both an SI port and a D port; and e) replace the stitched scan equivalent logical registers having the same net on both the SI port and D port.

4. The circuit synthesis system of claim 1 wherein the logical registers comprise flip-flop elements, and wherein the processing circuitry is operative to identify flip-flop elements that are stitched as a shift register.

5. The circuit synthesis system of claim 4 wherein the ATPG algorithm is operative to transform all the flip-flop elements into respective MUX flip-flop elements.

6. The circuit synthesis system of claim 5 wherein the processing circuitry is further operative to stitch the MUX flip-flop elements following the order in which the MUX flip-flop elements were extracted.

7. The circuit synthesis system of claim 1 wherein the processing circuitry is further operative to screen the netlist and replace all the MUX flip-flop elements having the same net on the SI port and the D port with a D flip-flop.

8. A method of reducing area used during test insertion when using an automatic test pattern generator (ATPG) algorithm, comprising:
   identifying a netlist of an integrated circuit which includes nets;
   identifying a plurality of logical registers of the integrated circuit that are stitched as a shift register;
   transforming the identified logical registers into scan equivalent logical registers, wherein each scan equivalent logical register has an SI port and a D port;
   stitching the scan equivalent logical registers following the order in which the scan equivalent logical registers were extracted; and
   identifying the stitched scan equivalent logical registers having the same net on the respective SI ports and D ports; and
   replacing the stitched scan equivalent logical registers having the same net on the respective SI ports and D ports with a logical register.

9. The method of claim 8 wherein the step of transforming the identified logical registers into scan equivalent logical registers comprises using an automatic test pattern generation (ATPG) program to transform the identified logical registers into scan equivalent logical registers.

10. The method of claim 9 wherein the scan equivalent of each D flip-flop elements comprises a MUX flip-flop element.

11. The method of claim 8 wherein the logical registers of the integrated circuit each comprise a D flip-flop element.

12. The method of claim 8 wherein the steps of identifying the logical registers and transforming the identified logical registers comprises extracting the scan equivalent logical registers.

13. The method of claim 8 wherein the steps of identifying the stitched scan equivalent logical registers having the same net on the respective SI ports and D ports and replacing the stitched scan equivalent logical registers results in reducing layout area of the integrated circuit during scan insertion.

14. In an electronic design automation system having a processor, memory and an automatic test pattern generation (ATPG) algorithm for designing and testing an integrated circuit, the logic design of the integrated circuit including nets of the integrated circuit providing a netlist, a method of reducing area used during test insertion when using the ATPG algorithm, comprising:
   providing a netlist associated with an integrated circuit;
   screening the netlist to identify flip-flop elements that are stitched as a shift register;
   transforming all the identified flip-flop elements that are stitched as a shift register into respective scan equivalent flip-flop elements with the ATPG algorithm wherein each scan equivalent flip-flop element includes an SI port and a D port;
   stitching the scan equivalent flip-flop elements following the order in which the scan equivalent flip-flop elements were extracted; and
   replacing at least one of a plurality of the scan equivalent flip-flop elements having the same net on the SI port and the D port by a flip-flop element.

15. The method of claim 14 wherein the identified flip-flop elements that are stitched as a shift register each comprise a D flip-flop element, and wherein the corresponding scan equivalent flip-flop element comprises a MUX flip-flop element.

16. The method of claim 14 wherein the step of screening the netlist comprises searching all elements of the netlist in order to identify each flip-flop element that is stitched as a shift register.

17. The method of claim 14 wherein the step of providing a netlist associated with an integrated circuit comprises identifying a netlist of an integrated circuit which includes nets.

18. The method of claim 14 wherein the plurality of scan equivalent flip-flop elements having the same net on the SI port and the D port comprises N scan equivalent flip-flop elements, and wherein the step of replacing at least one of a plurality of the scan equivalent flip-flop elements having the same net on the SI port and the D port by a flip-flop element comprises replacing N−1 scan equivalent flip-flop elements by a flip-flop element.

19. The method of claim 14 wherein the identified flip-flop elements each comprise a two-port D flip-flop that is configured to be loaded from one of two separate sources.

20. The method of claim 19 wherein one of the ports comprises a scan input (SI) port.

21. The method of claim 20 wherein another of the ports comprises a D port.

22. In an electronic design automation system having a processor, memory and an automatic test pattern generation (ATPG) algorithm for designing and testing an integrated circuit, the logic design of the integrated circuit including nets of the integrated circuit providing a netlist, a method of reducing area used during test insertion when using the ATPG algorithm, comprising:
   providing a list of flip-flop elements that are stitched as a shift register;
   transforming all the identified flip-flop elements that are stitched as a shift register into respective scan equivalent flip-flop elements with the ATPG algorithm wherein each scan equivalent flip-flop element includes an SI port and a D port;
   stitching the scan equivalent flip-flop elements following the order in which the scan equivalent flip-flop elements were extracted; and
   replacing at least one of a plurality of the scan equivalent flip-flop elements having the same net on the SI port and the D port by a flip-flop element.

23. The method of claim 22 wherein the flip-flop elements each comprise a D flip-flop element, and the scan equivalent flip-flop elements each comprise a MUX flip-flop element.

24. The method of claim 22 wherein the plurality of scan equivalent flip-flop elements comprises N flip-flop elements, and wherein the step of replacing at least one of a plurality of the scan equivalent flip-flop elements comprises replacing N−1 flip-flop elements having the same net on the SI port and the D port by a flip-flop element.

25. The method of claim 22 wherein the integrated circuit comprises a shift register.

26. The method of claim 22 wherein the integrated circuit comprises a linear feedback shift register (LFSR).

27. The method of claim 22 wherein the integrated circuit comprises a serial-to-parallel converter.

28. The method of claim 22 wherein the integrated circuit comprises a parallel-to-serial converter.

29. The method of claim 22 wherein the integrated circuit comprises a state machine including a token ring.

30. The method of claim 22 wherein the integrated circuit comprises a digital filter.

31. The method of claim 22 wherein each of the flip-flop elements is coupled with combinational logic.

32. The method of claim 31 wherein the combinational logic comprises glue logic.

* * * * *